US009524976B2

United States Patent
Pachamuthu et al.

(10) Patent No.: US 9,524,976 B2
(45) Date of Patent: Dec. 20, 2016

(54) METHOD OF INTEGRATING SELECT GATE SOURCE AND MEMORY HOLE FOR THREE-DIMENSIONAL NON-VOLATILE MEMORY DEVICE

(71) Applicant: SanDisk Technologies, Inc., Plano, TX (US)

(72) Inventors: Jayavel Pachamuthu, San Jose, CA (US); Johann Alsmeier, San Jose, CA (US); Henry Chien, San Jose, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/341,079

(22) Filed: Jul. 25, 2014

(65) Prior Publication Data

US 2015/0076580 A1    Mar. 19, 2015

Related U.S. Application Data

(60) Provisional application No. 61/878,023, filed on Sep. 15, 2013, provisional application No. 61/977,193, filed on Apr. 9, 2014.

(51) Int. Cl.
*H01L 27/115* (2006.01)

(52) U.S. Cl.
CPC ..... *H01L 27/11551* (2013.01); *H01L 27/1157* (2013.01); *H01L 27/11524* (2013.01);
(Continued)

(58) Field of Classification Search
CPC .................. H01L 27/11551; H01L 27/11578; H01L 21/02115; H01L 27/1157
See application file for complete search history.

(56) References Cited

U.S. PATENT DOCUMENTS

| 5,915,167 A | 6/1999 | Leedy | |
|---|---|---|---|
| 6,204,119 B1 * | 3/2001 | Lange | H01L 28/87 257/E21.016 |

(Continued)

OTHER PUBLICATIONS

Invitation to Pay Additional Fees, including Annex to Form PCT/ISA/206 Communication Relating to The Results of the Partial International Search for PCT/US2014/048160, issued on Oct. 31, 2014.

(Continued)

*Primary Examiner* — Daniel Whalen
*Assistant Examiner* — Suberr Chi
(74) *Attorney, Agent, or Firm* — The Marbury Law Group PLLC

(57) ABSTRACT

A method of fabricating a semiconductor device, such as a three-dimensional NAND memory string, includes forming a carbon etch stop layer having a first width over a major surface of a substrate, forming a stack of alternating material layers over the etch stop layer, etching the stack to the etch stop layer to form a memory opening having a second width at a bottom of the memory opening that is smaller than the width of the etch stop layer, removing the etch stop layer to provide a void area having a larger width than the second width of the memory opening, forming a memory film over a sidewall of the memory opening and in the void area, and forming a semiconductor channel in the memory opening such that the memory film is located between the semiconductor channel and the sidewall of the memory opening.

32 Claims, 14 Drawing Sheets

(52) U.S. Cl.
CPC .. *H01L 27/11556* (2013.01); *H01L 27/11578* (2013.01); *H01L 27/11582* (2013.01)

(56) References Cited

U.S. PATENT DOCUMENTS

| | | | |
|---|---|---|---|
| 6,664,154 B1* | 12/2003 | Bell et al. | 438/197 |
| 2007/0252201 A1* | 11/2007 | Kito et al. | 257/331 |
| 2011/0143524 A1* | 6/2011 | Son et al. | 438/479 |
| 2011/0291178 A1* | 12/2011 | Sasaki et al. | 438/268 |
| 2013/0134492 A1 | 5/2013 | Yang et al. | |
| 2014/0264533 A1 | 9/2014 | Simsek-Ege et al. | |
| 2014/0264542 A1 | 9/2014 | Simsek-Ege et al. | |

OTHER PUBLICATIONS

International Search Report and Written Opinion received in connection with international Application No. PCT/US2014/048160: mailed Mar. 13, 2015.

\* cited by examiner

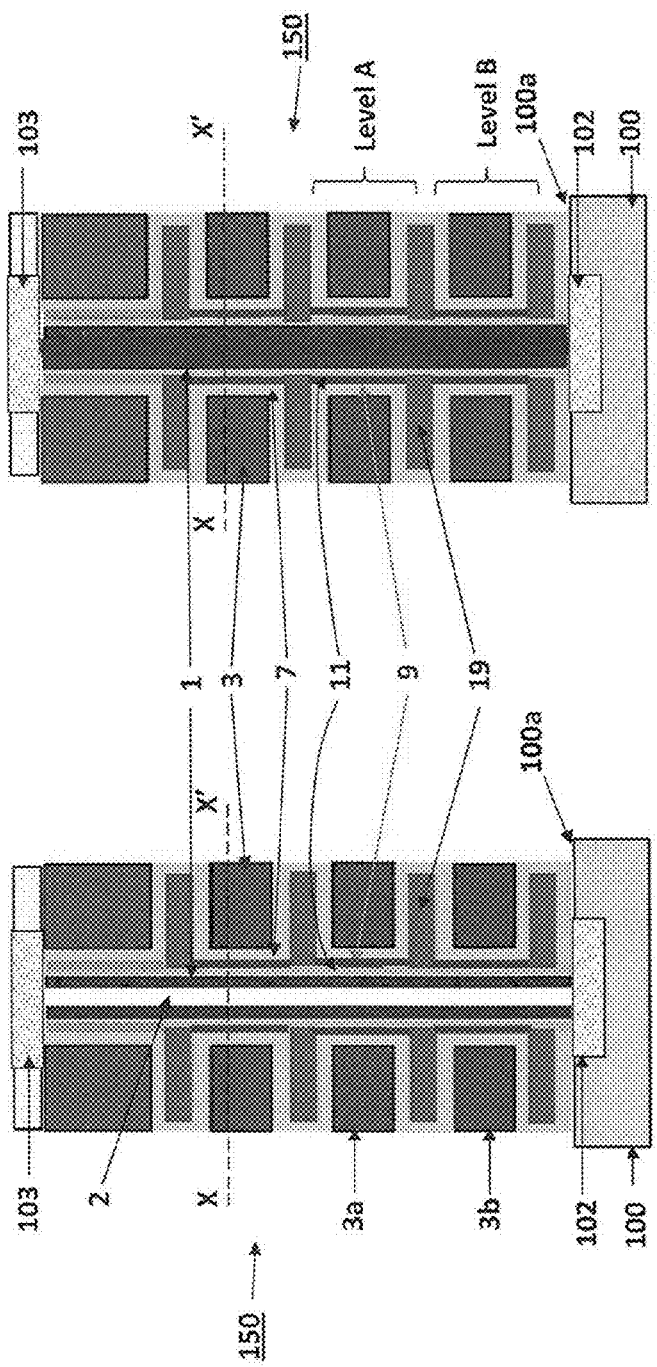
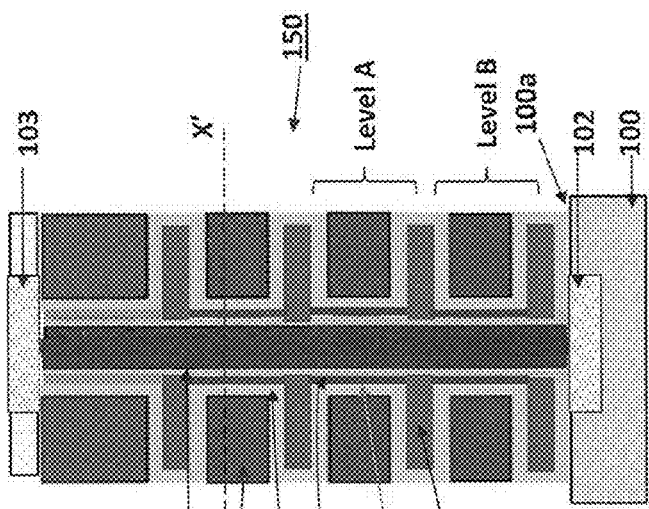
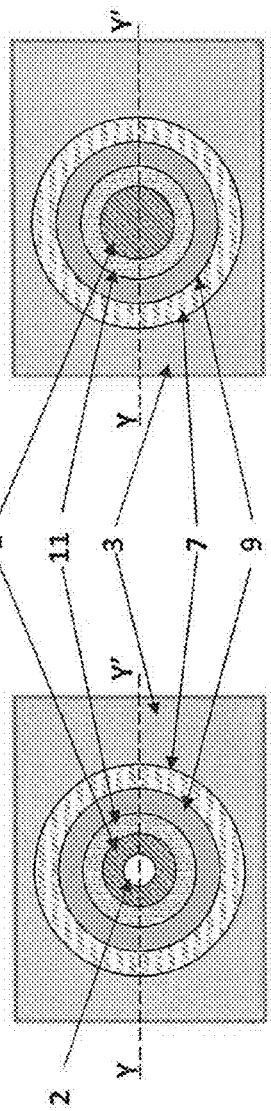

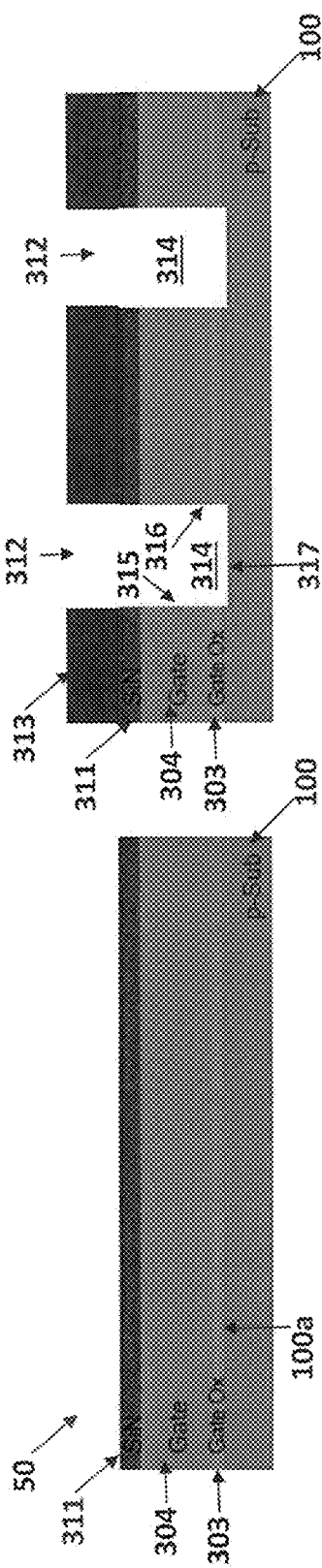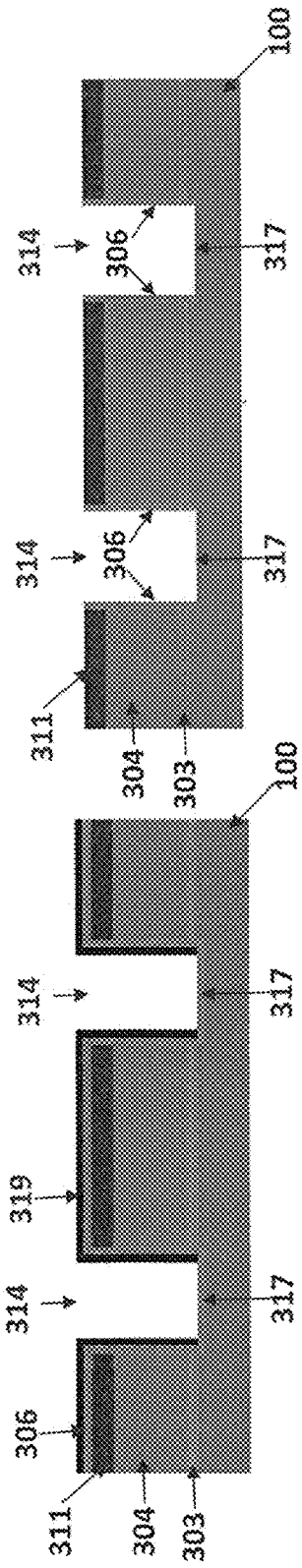
Fig. 3A
Fig. 3B
Fig. 3C
Fig. 3D

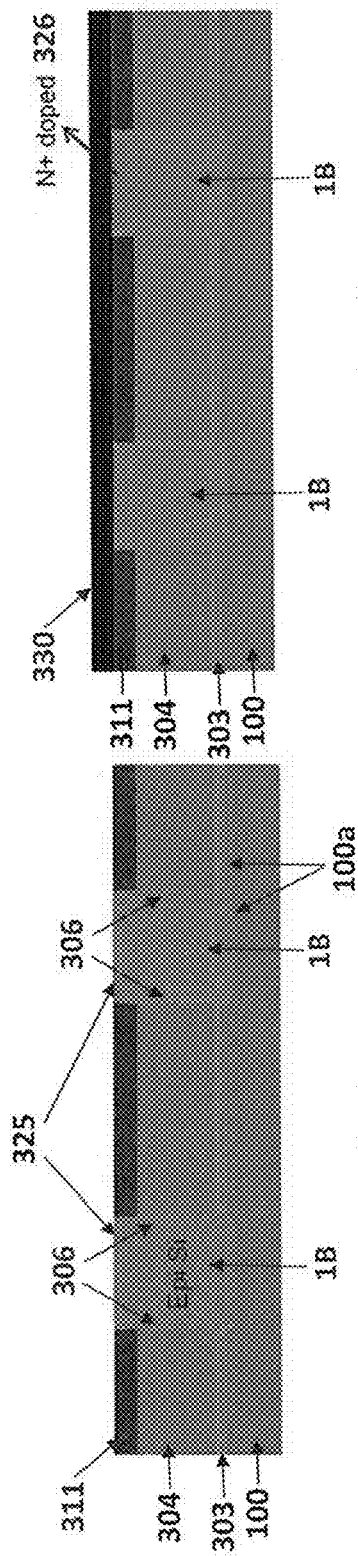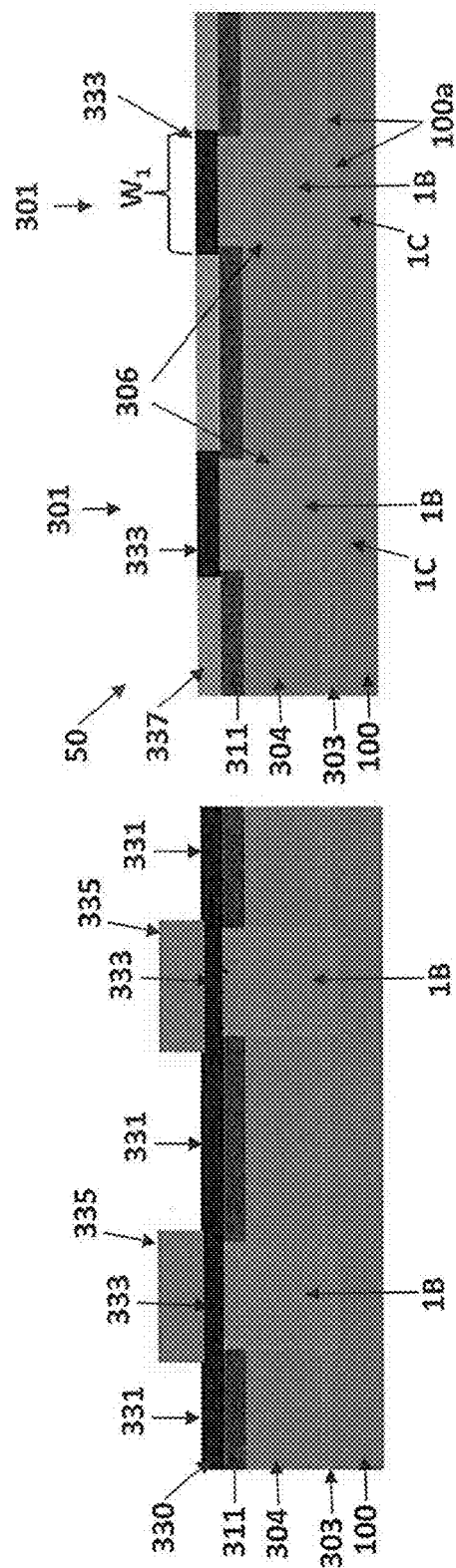

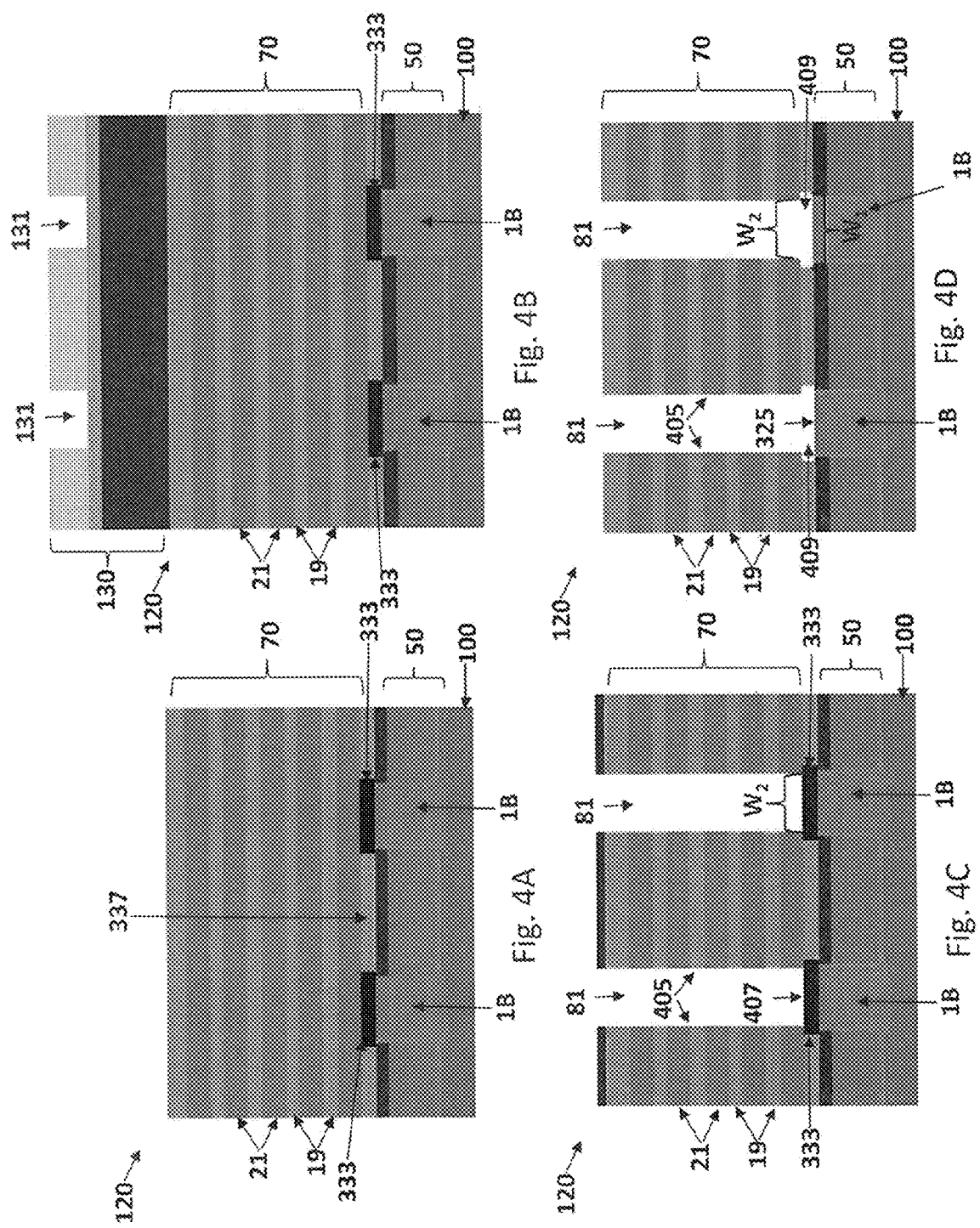

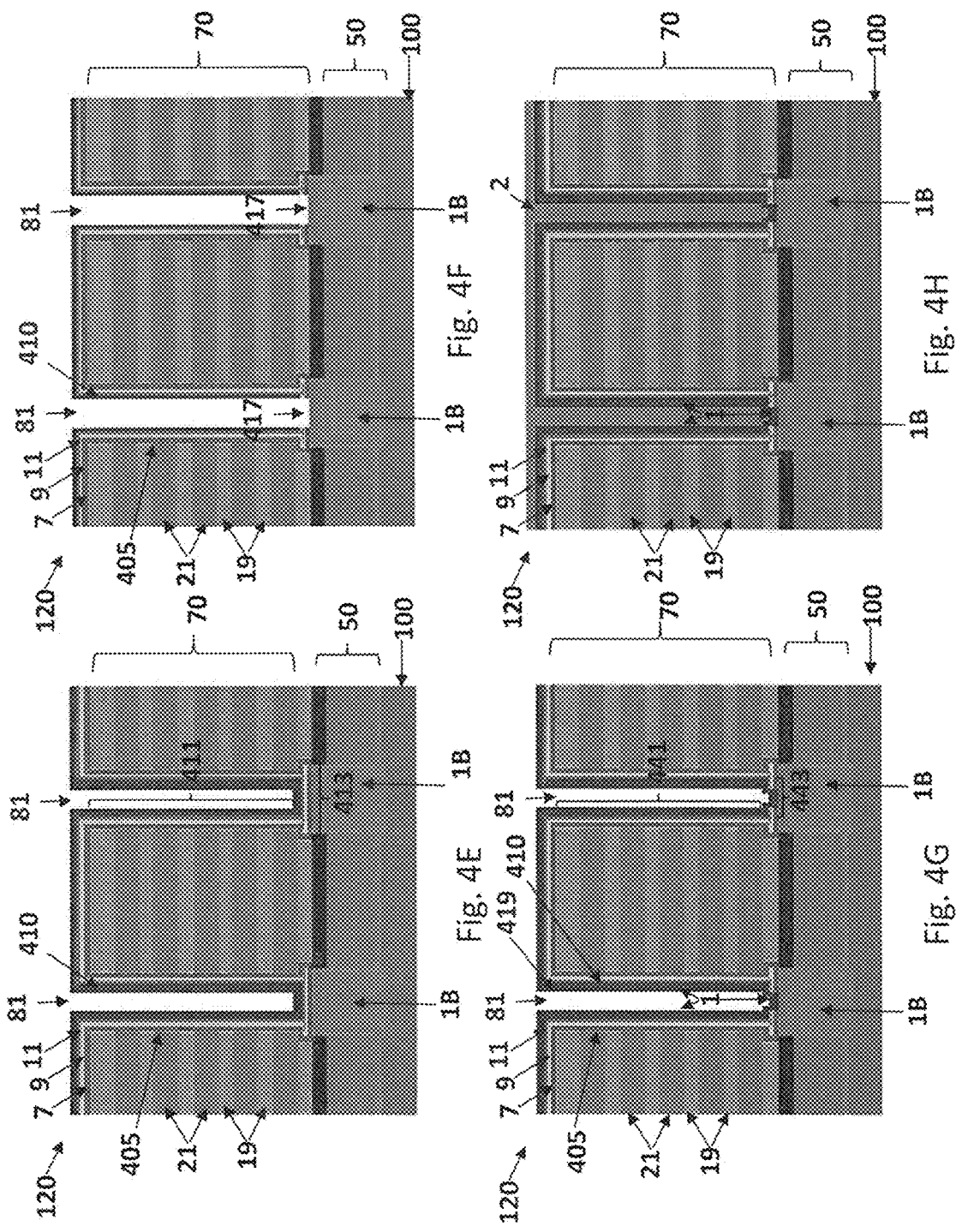

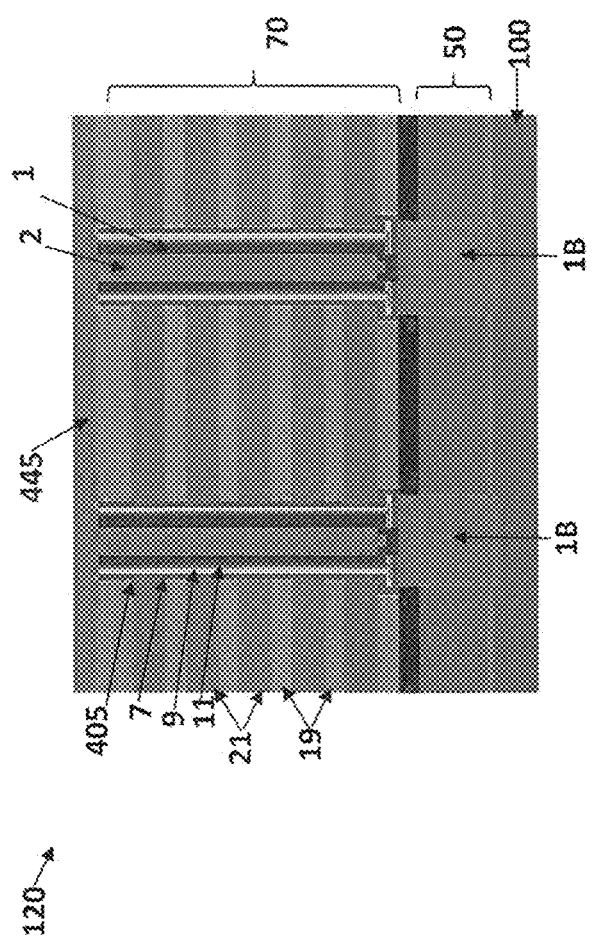

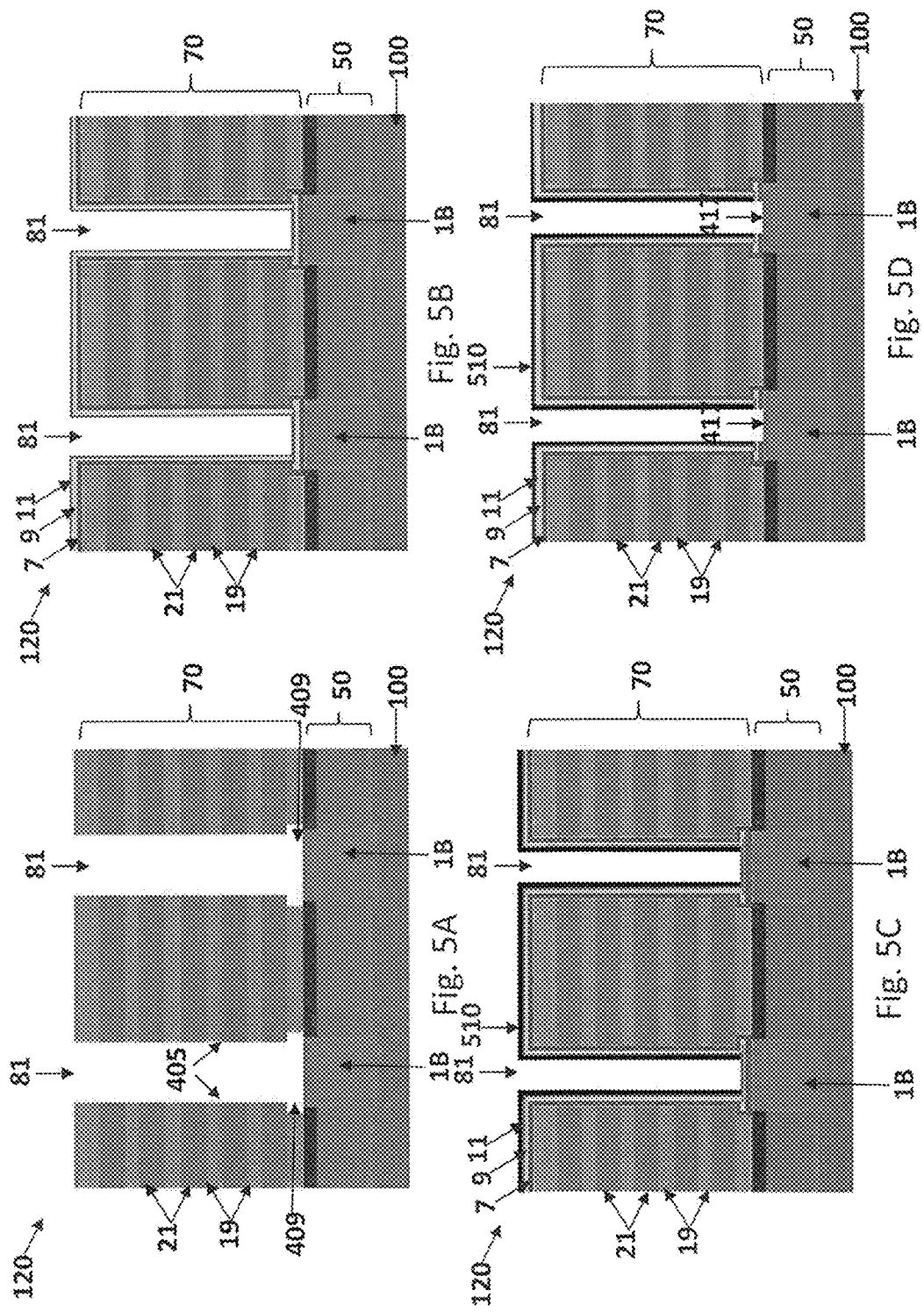

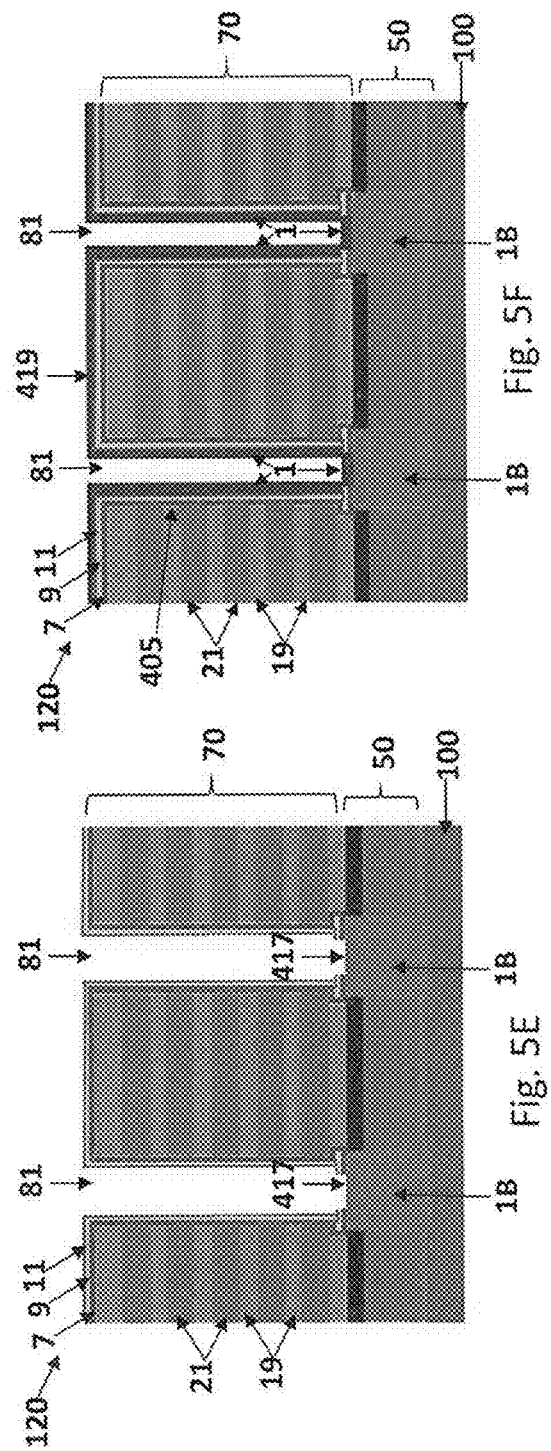

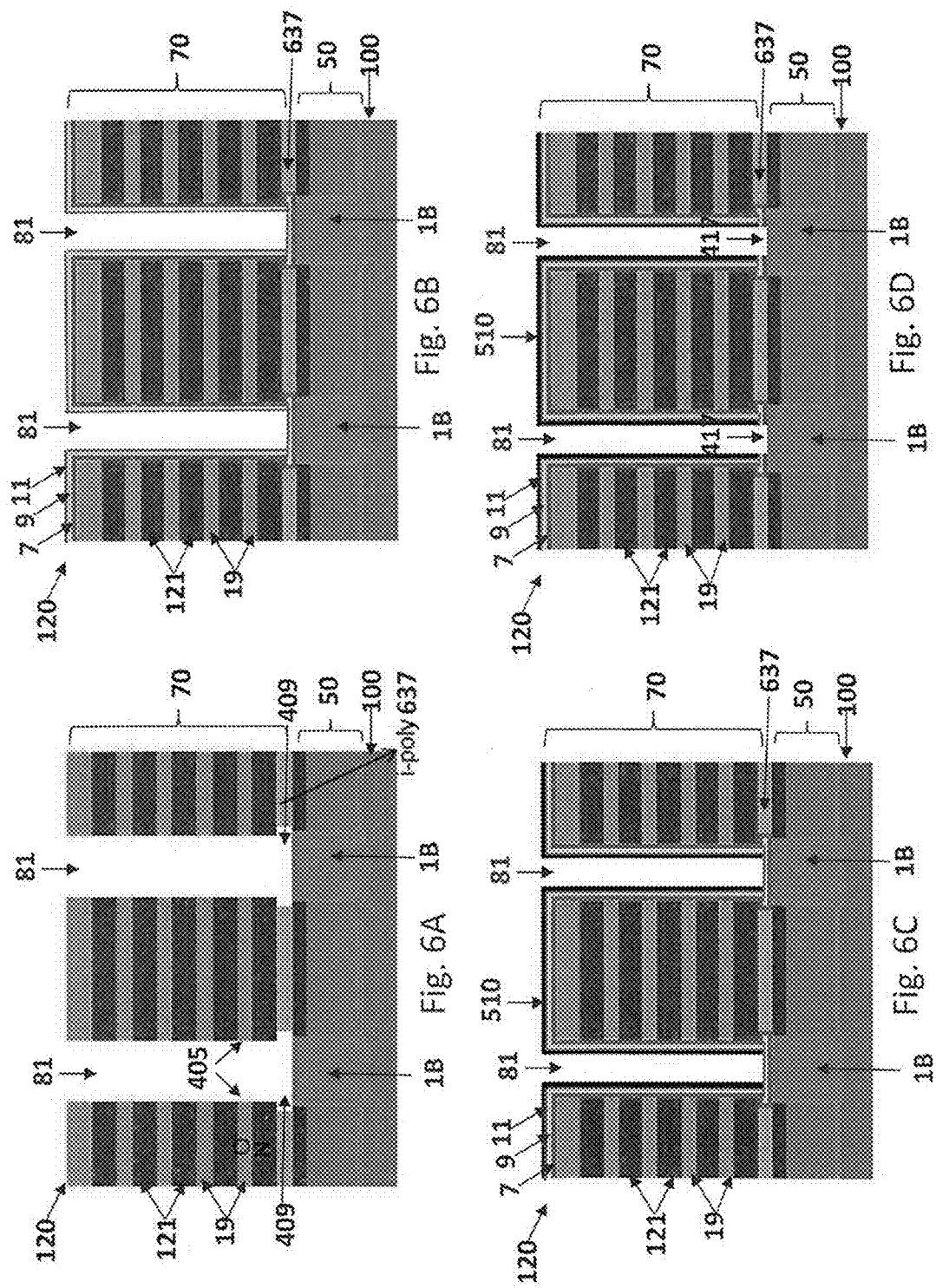

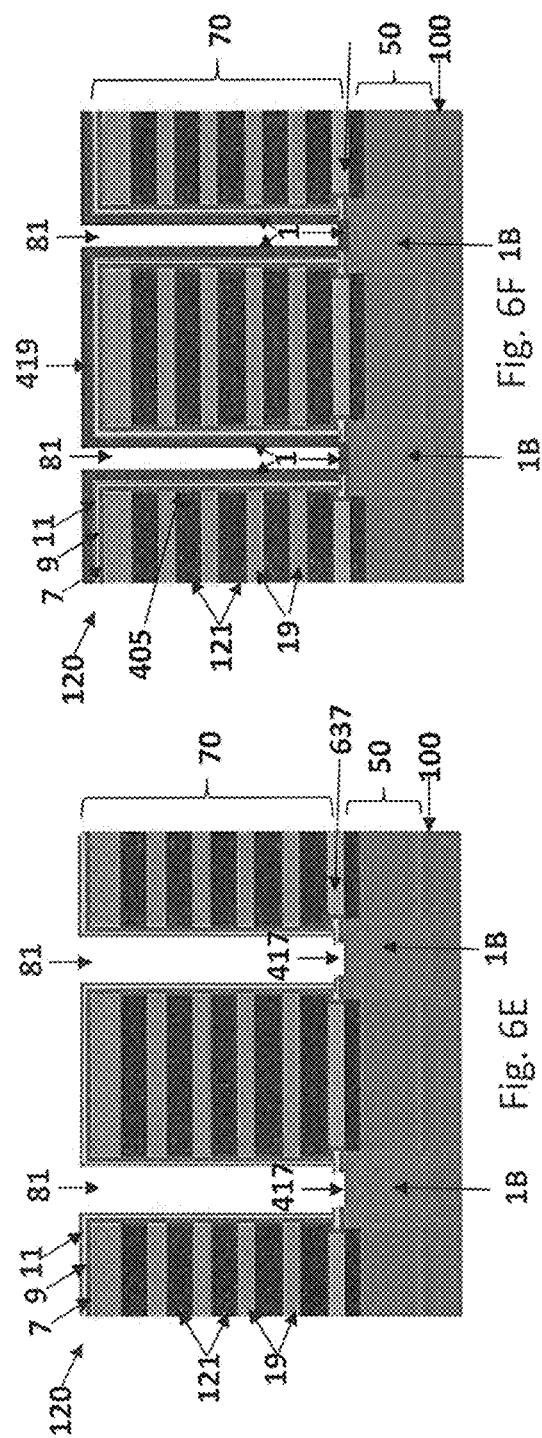

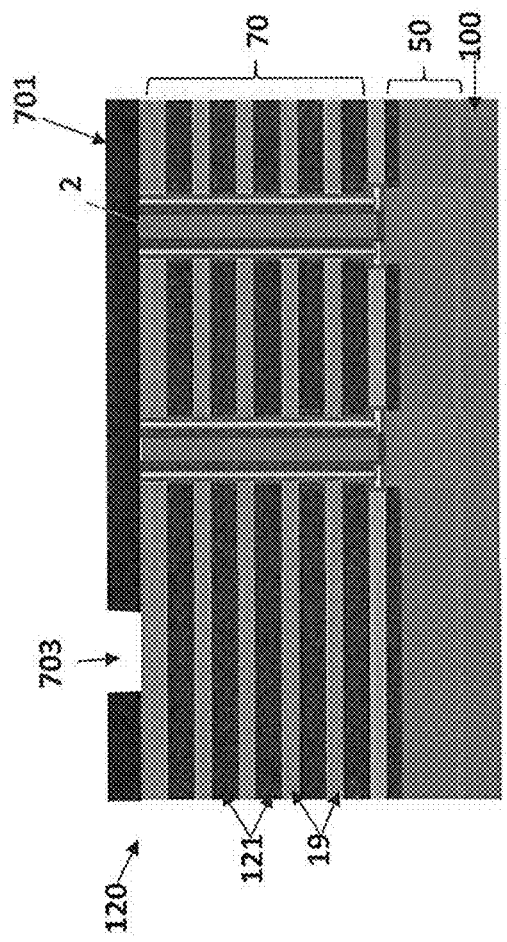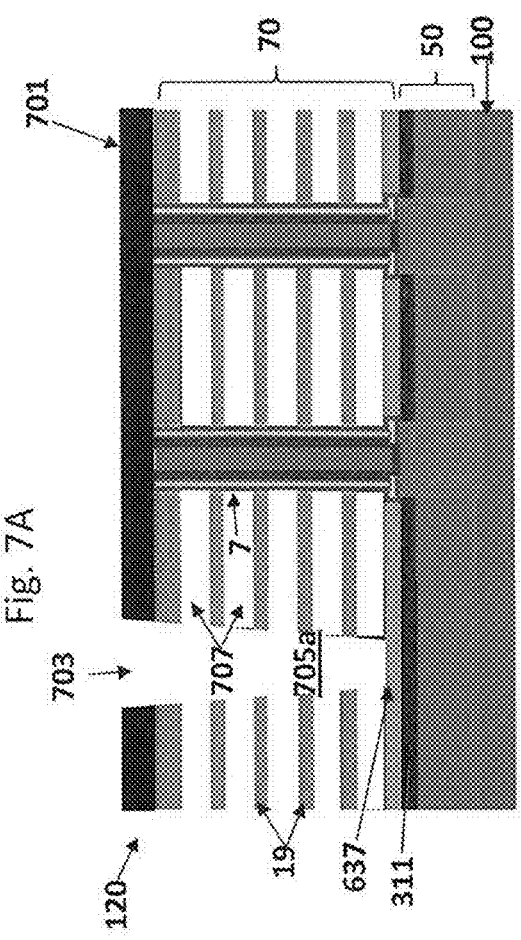

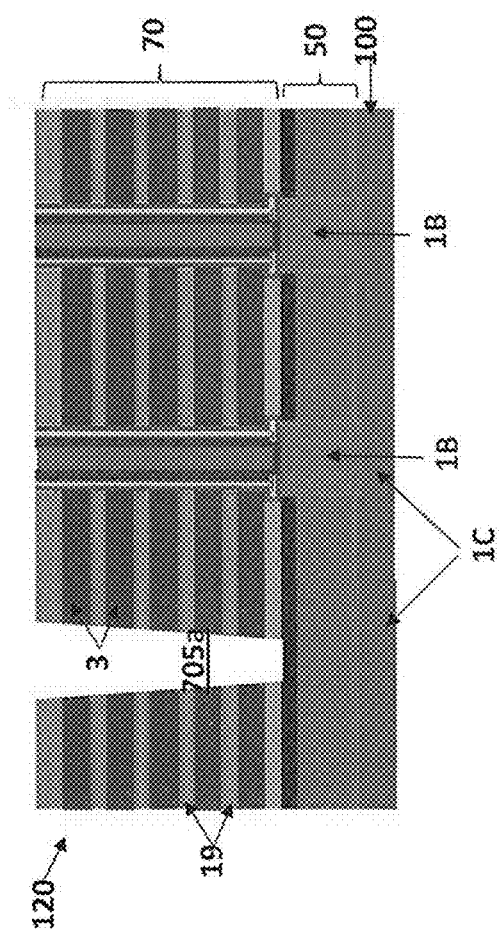
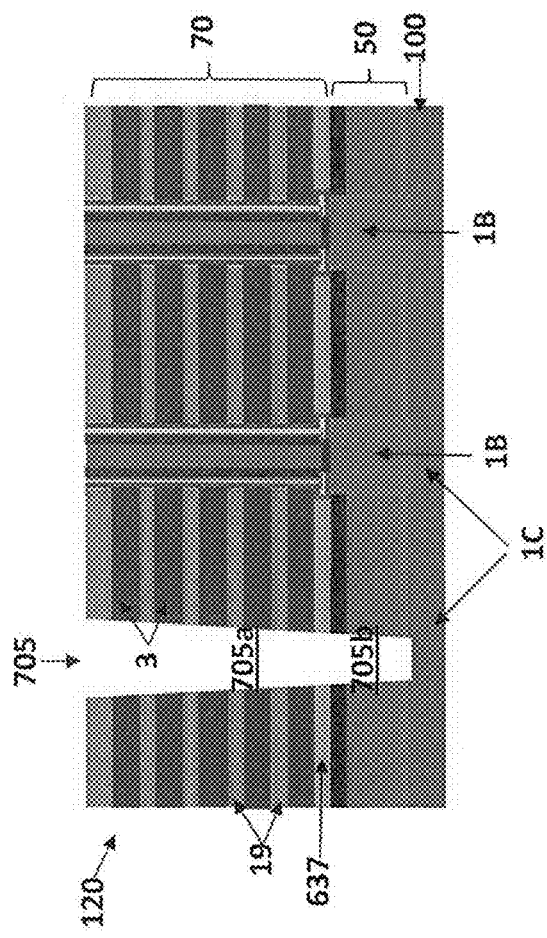

METHOD OF INTEGRATING SELECT GATE SOURCE AND MEMORY HOLE FOR THREE-DIMENSIONAL NON-VOLATILE MEMORY DEVICE

RELATED APPLICATIONS

This application claims the benefit of priority of (1) U.S. Provisional Patent Application No. 61/878,023, filed Sep. 15, 2013, and (2) U.S. Provisional Patent Application No. 61/977,193, filed Apr. 9, 2014, both of which are incorporated herein by reference in their entirety.

FIELD

The present invention relates generally to the field of semiconductor devices and specifically to three dimensional non-volatile memory, such as vertical NAND strings, and other three dimensional devices and methods of making thereof.

BACKGROUND

Recently, ultra high density storage devices have been proposed using a three-dimensional (3D) stacked memory structure sometimes referred to as a Bit Cost Scalable (BiCS) architecture. For example, a 3D NAND stacked memory device can be formed from an array of alternating conductive and dielectric layers. A memory hole is formed through the layers to define many memory layers simultaneously. A NAND string is then formed by filling the memory hole with appropriate materials. A straight NAND string extends in one memory hole, while a pipe- or U-shaped NAND string (p-BiCS) includes a pair of vertical columns of memory cells. Control gates of the memory cells may be provided by the conductive layers.

SUMMARY

Embodiments relate to a method of fabricating a memory device that includes forming a carbon etch stop layer having a first width dimension over a major surface of a substrate, forming a stack of alternating layers of a first material and a second material different from the first material over the carbon etch stop layer, etching the stack through a mask to the carbon etch stop layer to form a memory opening having a second width dimension at a bottom of the memory opening proximate to the carbon etch stop layer that is smaller than the first width dimension of the carbon etch stop layer, removing the carbon etch stop layer to provide a void area between the bottom of the memory opening and a top surface of a protrusion comprising a semiconductor material, the void area having a larger width dimension than the second width dimension of the memory opening, forming at least a portion of a memory film over a sidewall of the memory opening and in the void area, and forming a semiconductor channel in the memory opening such that the memory film is located between the semiconductor channel and the sidewall of the memory opening.

Further embodiments relate to a three-dimensional memory device, such as a three-dimensional NAND string memory device, that includes a semiconductor substrate having a major surface, a protrusion comprising a semiconductor material located in or over the major surface of the semiconductor substrate, the protrusion having a top surface substantially parallel to the major surface of the substrate, a first side surface and a second side surface opposite the first side surface, a select gate electrode extending over and parallel to the major surface of the semiconductor substrate and adjacent to the first and second side surfaces of the protrusion, and a gate insulating layer extending between the select gate electrode and the major surface of the substrate and between the select gate electrode and the first and second side surfaces of the protrusion. The memory device further includes a stack of alternating insulating material layers and control gate electrodes located over the substrate above the protrusion and the select gate electrode and having a memory opening extending through the stack in a direction substantially perpendicular to the major surface of the substrate, wherein a width dimension of the memory opening increases adjacent to the top surface of the protrusion. A semiconductor channel has at least one first portion extending substantially perpendicular to the major surface of the substrate in the memory opening and a bottom portion that electrically contacts the top surface of the protrusion, and at least one memory film is located in the memory opening between the first portion of the semiconductor channel and the plurality of conductive control gate electrodes.

Further embodiments relate to a method of fabricating a memory device that includes forming a semiconductor material etch stop layer over a major surface of a substrate, forming a stack of alternating layers of a first material and a second material different from the first material over the semiconductor material etch stop layer, etching the stack through a mask to the semiconductor material etch stop layer to form a memory opening having a first width dimension at a bottom of the memory opening proximate to the semiconductor etch stop layer, selectively etching the semiconductor material etch stop layer through the memory opening to provide a void area between the bottom of the memory opening and a top surface of a protrusion comprising a semiconductor material, the void area having a larger width dimension than the first width dimension of the memory opening, forming at least a portion of a memory film over a sidewall of the memory opening and in the void area, and forming a semiconductor channel in the memory opening such that the memory film is located between the semiconductor channel and the sidewall of the memory opening.

BRIEF DESCRIPTION OF THE DRAWINGS

FIGS. 1A-1B are respectively side cross sectional and top cross sectional views of a NAND string of one embodiment. FIG. 1A is a side cross sectional view of the device along line Y-Y' in FIG. 1B, while FIG. 1B is a side cross sectional view of the device along line X-X' in FIG. 1A.

FIGS. 1C-1D are respectively side cross sectional and top cross sectional views of a NAND string of another embodiment. FIG. 1C is a side cross sectional view of the device along line Y-Y' in FIG. 1D, while FIG. 1D is a side cross sectional view of the device along line X-X' in FIG. 1C.

FIGS. 3A-3H are partial side cross-sectional views of a stack of material layers over a substrate and illustrate a method of forming a select gate level of a memory device according to an embodiment.

FIGS. 4A-4I are partial side cross-sectional views of a material layer stack over a substrate that illustrate a method of fabricating NAND memory strings according to one embodiment.

FIGS. 5A-5F are partial side cross-sectional views of a material layer stack over a substrate that illustrate a method of fabricating NAND memory strings according to another embodiment.

FIGS. 6A-6F are partial side cross-sectional views of a material layer stack over a substrate that illustrate a method of fabricating NAND memory strings according to another embodiment.

FIGS. 7A-7F are partial side cross-sectional views of a material layer stack that illustrate a method of forming control gate electrodes and a select line for a plurality of NAND memory strings.

DETAILED DESCRIPTION

The embodiments of the invention provide a method for fabricating a semiconductor device, such as a three dimensional monolithic memory array comprising a plurality of NAND memory strings.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and adhering the memory levels atop each other, as in Leedy, U.S. Pat. No. 5,915,167, titled "Three Dimensional Structure Memory." The substrates may be thinned or removed from the memory levels before bonding, but as the memory levels are initially formed over separate substrates, such memories are not true monolithic three dimensional memory arrays.

Figure 2:
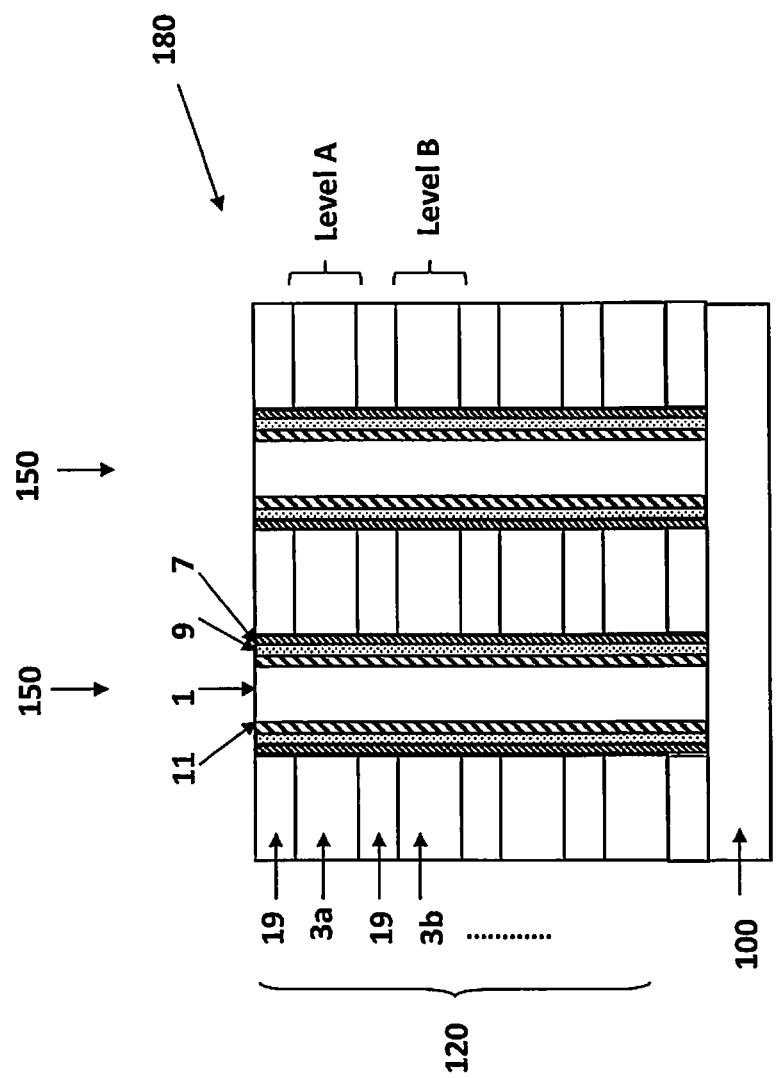
FIG. 2 is a partial side cross-sectional view of a memory device comprising a plurality of NAND strings formed in a stack of material layers over a substrate.

In some embodiments, a monolithic three dimensional NAND string 150 comprises a semiconductor channel 1 having at least one end portion extending substantially perpendicular to a major surface 100a of a substrate 100, as shown in FIGS. 1A, 1C and 2. For example, the semiconductor channel 1 may have a pillar shape extending through a plurality of memory device levels (Level A, Level B, etc.) and the entire pillar-shaped semiconductor channel in the memory device levels extends substantially perpendicularly to the major surface 100a of the substrate 100, as shown in FIGS. 1A, 1C and 2. The channels 1 may be electrically connected to first and second (e.g., source and drain) electrodes 102, 103 which are schematically shown in FIGS. 1A and 1C. The first (e.g., source) electrode 102 may connect to the bottom of the channel 1 and the second (e.g., drain electrode 103) may connect to the top of the channel 1. The NAND string 150 may further include drain-side and source-side select or access transistors (not shown in FIGS. 1A-2 for clarity) which may be located above and below the memory levels of the NAND string 150, respectively.

In some embodiments, the semiconductor channel 1 may be a filled feature, as shown in FIGS. 1C and 1D. In some other embodiments, the semiconductor channel 1 may be hollow, for example a hollow cylinder filled with an insulating fill material 2, as shown in FIGS. 1A and 1B. In these embodiments, an insulating fill material 2 may be formed to fill the hollow part surrounded by the semiconductor channel 1.

A memory device 180 may comprise a plurality of NAND strings 150 formed in a stack 120 of material layers over the substrate 100, as shown in FIG. 2. The substrate 100 can be any semiconducting substrate known in the art, such as monocrystalline silicon, IV-IV compounds such as silicon-germanium or silicon-germanium-carbon, III-V compounds, II-VI compounds, epitaxial layers over such substrates, or any other semiconducting or non-semiconducting material, such as silicon oxide, glass, plastic, metal or ceramic substrate. The substrate 100 may include integrated circuits fabricated thereon, such as driver circuits for a memory device.

Any suitable semiconductor materials can be used for semiconductor channel 1, for example silicon, germanium, silicon germanium, or other compound semiconductor materials, such as III-V, II-VI, or conductive or semiconductive oxides, etc. The semiconductor material may be amorphous, polycrystalline or single crystal. The semiconductor channel material may be formed by any suitable deposition methods. For example, in one embodiment, the semiconductor channel material is deposited by low pressure chemical vapor deposition (LPCVD). In some other embodiments, the semiconductor channel material may be a recrystallized polycrystalline semiconductor material formed by recrystallizing an initially deposited amorphous semiconductor material.

The insulating fill material 2 may comprise any electrically insulating material, such as silicon oxide, silicon nitride, silicon oxynitride, or other high-k insulating materials.

The monolithic three dimensional NAND strings 150 further comprise a plurality of control gate electrodes 3 as shown in FIGS. 1A-2. The control gate electrodes 3 may comprise a portion having a strip shape extending substantially parallel to the major surface 100a of the substrate 100. The plurality of control gate electrodes 3 comprise at least a first control gate electrode 3a located in a first device level (e.g., memory device level A) and a second control gate electrode 3b located in a second device level (e.g., memory device level B) located over the major surface 100a of the substrate 100 and below the device level A. The control gate material may comprise any one or more suitable conductive or semiconductor control gate material known in the art, such as doped polysilicon, tungsten, tungsten nitride, copper, aluminum, tantalum, titanium, cobalt, titanium nitride, alloys thereof or combination of these materials. For example, the control gate material in FIGS. 1A-1D may comprise a conductive metal or metal alloy, such as tungsten, titanium nitride, and/or tungsten nitride, while the control gate material in FIG. 2 may comprise doped polysilicon.

A blocking dielectric 7 is located adjacent to the control gate(s) 3 and may surround the control gate 3, as shown in FIGS. 1A and 1C. Alternatively, a straight blocking dielectric layer 7 may be located only adjacent to an edge (i.e., minor surface) of each control gate 3, as shown in FIG. 2. The blocking dielectric 7 may comprise one or more layers having plurality of blocking dielectric segments located in contact with a respective one of the plurality of control gate electrodes 3. Alternatively, the blocking dielectric 7 may comprise one or more continuous layers which extend the entire length of the memory cell portion of the NAND string 150, as shown in FIG. 2.

The monolithic three dimensional NAND string also comprise a charge storage region 9. The charge storage region 9 may comprise one or more continuous layers which extend the entire length of the memory cell portion of the NAND string as shown in FIG. 2. For example, the charge storage region 9 may comprise an insulating charge trapping material, such as a silicon nitride layer. Alternatively, the charge storage region may comprise a plurality of discrete charge storage regions or segments 9 located between the blocking dielectric 7 and the channel 1, as shown in FIGS. 1A and 1C. The discrete charge storage regions 9 may comprise a plurality of vertically spaced apart, conductive (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof), or semiconductor (e.g., polysilicon) floating gates. Alternatively, the discrete charge storage regions 9 may comprise an insulating charge trapping material, such as silicon nitride segments. Alternatively, the charge storage region 9 may comprise conductive nanoparticles, such as metal nanoparticles, for example ruthenium nanoparticles.

The tunnel dielectric 11 of the monolithic three dimensional NAND string is located between charge storage region 9 and the semiconductor channel 1.

The blocking dielectric 7 and the tunnel dielectric 11 may be independently selected from any one or more same or different electrically insulating materials, such as silicon oxide, silicon nitride, silicon oxynitride, or other insulating materials, such as metal oxide materials, for example aluminum oxide or hafnium oxide. The blocking dielectric 7 and/or the tunnel dielectric 11 may include multiple layers of silicon oxide, silicon nitride and/or silicon oxynitride (e.g., ONO layers).

In various embodiments, the three-dimensional NAND string 150 may have a generally pillar shape that extends substantially perpendicular to the major surface of the substrate 100, with a first (e.g., drain) electrode 103 that connects to the NAND string 150 at the top of the NAND string 150 (i.e., distal to the substrate 100) and a second (e.g., source) electrode 102 that connects to the NAND string 150 at the bottom of the NAND string 150 (i.e., proximate to the substrate 100). In embodiments, each NAND string 150 may have a first select or access transistor (e.g., a drain-side select gate transistor) located above the memory levels of the NAND string 150, and a second select or access transistor (e.g., a source-side select gate transistor) located below the memory levels of the NAND string 150. Since the second or source-side select gate transistor is located below the memory levels of the NAND string 150, forming effective contact between the semiconductor channel 1 of the NAND string 150 and the underlying select gate region of the device has proven challenging, particularly for high aspect ratio NAND strings 150.

Various embodiments include methods of making a memory device such as a monolithic three-dimensional NAND string memory device. FIGS. 3A-3H illustrate a method of making a memory device according to a first, non-limiting embodiment of the invention. The method of FIGS. 3A-3H may result in a higher quality gate insulating layer 306 for the source side select gate transistor 301. Specifically, a select gate electrode 304 may be formed over a first gate insulating layer 303 over a major surface 100a of the substrate 100. Then, the select gate electrode 304 and the first gate insulating layer 303 are etched through a mask to form one or more openings 314 having vertically-extending sidewalls 315, 316 and a horizontally-extending bottom surface 317 that exposes the surface of the substrate 100. A second gate insulating layer 306 is formed on the sidewalls 315, 316 and bottom surface 317 of the openings 314, and a sacrificial carbon spacer layer 319 is formed over the second gate insulating layer 306 on the sidewalls 315, 316 of the opening 314, but not over the bottom surface 317 of the opening 314. Then, the second gate insulating layer 306 is etched over the bottom surface 317 of the opening 314 to expose the substrate, and the sacrificial carbon spacer layer 319 is removed (such as by ashing) to expose the gate insulating layer 306 over the sidewalls 315, 316 of the opening 314. A protrusion comprising a semiconductor material, which later forms a channel portion 1B of the NAND string 150, is then formed in the opening 314, with the gate insulating layer 306 on the sidewalls 315, 316 of the opening 314 being located between the select gate electrode 304 and first and second side surfaces of the protrusion. The gate insulating layer 306 is not subject to processing damage because it is protected by the sacrificial carbon spacer layer 319 while the bottom surface of the opening 314 is etched to expose the surface of the semiconductor substrate 100. Further, in some embodiments the sacrificial carbon spacer layer 319 may be removed using a process (e.g., ashing) that does not damage or degrade the gate insulating layer 306. Thus, the vertical portions of the gate insulating layer 306 are not subjected to etching damage and may be higher quality than in prior art devices.

FIG. 3A illustrates a select gate portion 50 of a NAND string memory device according to one embodiment. To form the select gate portion 50 of FIG. 3A, a first gate insulating layer 303 (e.g., an oxide layer) may be formed over the surface of a semiconductor substrate 100. The first gate insulating layer 303 may be formed by oxidation of the exposed surface of the semiconductor (e.g., silicon) substrate 100. Any suitable oxidation process may be used, such as radical oxidation, dry oxidation, wet oxidation, etc to form a silicon oxide layer 303. Alternatively, rather than oxidizing the exposed surface, a layer 303 of insulating material, such as silicon oxide, may be deposited by chemical vapor deposition ("CVD") or sputtering.

A select gate electrode 304 may be formed over the first gate insulating layer 303. The select gate electrode 304 may comprise any suitable conductive material(s), such as a doped semiconductor material, a metal and/or metal alloy, and may be formed using any suitable process, such as via physical or chemical vapor deposition processes. An upper layer 311 of an insulating material (e.g., silicon nitride) may be provided over the select gate electrode 304.

A mask layer 313 is then formed over the upper layer 311 of insulating material. The mask layer 313 may comprise any suitable mask layer, such as photoresist or a hard mask material, such as amorphous carbon, silicon nitride, metal, etc., and may be patterned using photolithography. As shown in FIG. 3B, the mask layer 313 is patterned into a mask pattern defining open portions 312 in which layer 311 is exposed. The upper layer 311 of insulating material, the select gate electrode 304 and the first gate insulating layer 303 are etched through the mask 313 to the substrate 100 to form openings 314 corresponding to the locations of the open portions 312 in the mask 313 as shown in FIG. 3B. The layers 311, 304, 306 may be etched using reactive ion etching (RIE), for example. The select gate electrode 304 and the first gate insulating layer 306 may form at least a portion of the sidewalls 315, 316 of each opening 314, and the substrate 100 (e.g., surface 100a) may form the bottom surface 317 of each opening 314. The sidewalls 315, 316 may be opposite sides on one sidewall of a cylindrical opening 314. The mask layer 313 may be removed, as shown in FIG. 3C. A second gate insulating layer 306 may be formed over the upper layer 311 of insulating material and in the openings 314 over the sidewalls 315, 316 and bottom surface 317 of each opening 314, as shown in FIG. 3C. The second gate insulating layer 306 may comprise an insulating material, such as silicon oxide, and may be deposited using a suitable process, such as by chemical vapor deposition ("CVD") or sputtering. The mask layer 313 may be removed, as shown in FIG. 3C.

A sacrificial carbon spacer layer 319 may then be formed such that the sacrificial carbon spacer layer 319 preferentially forms over the second gate insulating layer 306 on the sidewalls 315, 316 but not on the bottom surface 317 of the openings 314. The sacrificial carbon spacer layer 319 may comprise a carbon material that is deposited by any suitable process, such as CVD. The selective formation of the sacrificial carbon spacer layer 319 on the sidewalls 315, 316 but not on the bottom surface 317 may be promoted by controlling the parameters of the carbon deposition, such as the carbon deposition temperature, the thickness of the carbon layer 319 and the aspect ratio of the openings 314. The deposition parameters may otherwise be similar to non-conformal deposition processes.

In FIG. 3D, the second gate insulating layer 306 may be etched on the bottom surface 317 of the openings 314 to expose the surface of the semiconductor substrate 100. In embodiments, the second gate insulating layer 306 may be etched using a dry etch process, such as RIE. During the etching, the sacrificial carbon spacer layer 319 may protect the vertically extending portions of the second gate insulating layer 306 over the sidewalls 315, 316 of the openings 314 from etching damage. Following the etching, the sacrificial carbon spacer layer 319 may be removed, such as by ashing, to expose the vertically extending portions of the second gate insulating layer 306 as shown in FIG. 3D. The second gate insulating layer 306 may remain over the upper layer of insulating material 311 (not shown for clarity).

In FIG. 3E, protrusions 1B comprising a semiconductor material are formed within the openings 314 and contact the surface (e.g., surface 100a) of the semiconductor substrate 100. As shown in FIG. 3E, an epitaxial single crystal semiconductor layer, such as a single crystal silicon layer may be epitaxially grown on the exposed major surface 100a of the substrate 100 over the bottom surfaces 317 of the openings 314. The epitaxial single crystal semiconductor layer may optionally be planarized, such as by chemical mechanical polishing (CMP) or an etch-back process, to remove any portions of the protrusion 1B extending above the top of the openings 314 and to define a top surface 325 of the protrusions 1B, which may be made planar with the top surface of the upper layer of insulating material 311, as shown in FIG. 3E. The second gate insulating layer 306 may also be removed from above the upper layer of insulating material 311 during planarization (e.g., CMP), and layer 311 may act as a polish stop. The protrusions 1B may optionally be implanted to form doped regions 326 (e.g., N+ doped regions) proximate the top surfaces 325 of the protrusions 1B, as shown in FIG. 3F.

In alternative embodiments, the protrusions 1B may be formed by forming an epitaxial single crystal semiconductor (e.g., silicon) layer on the exposed surface of the substrate to partially fill the openings 314, and forming at least one layer of a second material, such as a second semiconductor material (e.g., a polycrystalline semiconductor material, such as polysilicon), a metal and/or a metal nitride, over the epitaxial single crystal semiconductor layer within each of the openings 314. Alternatively, a polycrystalline semiconductor (e.g., silicon) layer (doped or undoped) may be formed to fill all or a portion of the opening 314 and may then be recrystallized by thermal treatment or by laser annealing to form a single crystal or large grain polycrystalline semiconductor material.

A carbon layer 330 may be formed over the top surfaces 325 of the protrusions 1B and over the upper layer of insulating material 311, as shown in FIG. 3F. The carbon layer 330 may comprise a carbon material that is deposited by any suitable process, such as CVD, PECVD, MBE, ALD, etc. The carbon layer 330 may comprise a carbon material that has a relatively low etch rate using a first etch process (e.g., a reactive ion etch process). In embodiments, the carbon layer 330 may be formed over the entire surface of the upper layer of insulating material 311 and the protrusions 1B, as shown in FIG. 3F. The carbon layer 330 may be patterned such that selected portions 331 of the layer 330 are removed while portions 333 of the layer 330 located above the protrusions 1B remain. For example, as shown in FIG. 3G, portions 333 of the layer 300 located above the protrusions 1B may be protected by a patterned mask 335 while exposed portions 331 of the layer 330 are removed via a suitable process, such as by etching or selective ashing. Removing the selected portions 331 of the layer 330 leaves discrete carbon etch stop layers 333 above each of the protrusions 1B, as shown in FIG. 3H. The carbon etch stop layers 333 may have a first width dimension, $W_1$, and may completely cover the top surfaces 325 of the protrusions 1B. In one embodiment, the first width dimension, $W_1$, may be greater than the width of the protrusions 1B. Following the formation of the discrete carbon etch stop layers 333, the patterned mask 335 may be removed.

In FIG. 3H, a layer 337 of dielectric material (e.g., an oxide material, such as silicon oxide, or a nitride material, such as silicon nitride) may be provided over the upper layer of insulating material 311 and adjacent to each of the carbon etch stop layers 333. In embodiments, the dielectric layer 337 may be formed over the upper layer of insulating material 311 and the carbon etch stop layers 333, and may be planarized (e.g., by CMP or etch-back) to remove the dielectric material from above the carbon etch stop layers 333 and to make the dielectric layer 337 planar with the carbon etch stop layers 333, as shown in FIG. 3H.

FIG. 3H illustrates a portion of a completed lower (e.g., source) select gate device level 50 comprising lower (e.g. source) select gate transistors 301 for a NAND string memory device. The select gate device level 50 includes a conductive select gate electrode 304 that extends generally parallel to the major surface 100a of the substrate 100 and a plurality of protrusions 1B that extend in a generally vertical direction from the major surface 100a of the semiconductor substrate 100 and are located adjacent to the select gate electrode 304. The protrusions 1B may comprise a semiconductor material and may form channel portions that extend generally perpendicular to the major surface of the substrate 100. The semiconductor channel portions 1B may comprise pillar- or rail-shaped protrusions that extend in a generally vertical direction from the semiconductor substrate 100, and may comprise epitaxial single crystal silicon, for example. Additional semiconductor channel portions 1C may be located on or in the substrate 100 and may extend in a direction that is generally parallel to the major surface of the substrate 100 (e.g., to the left and right or into and out of the page in FIG. 3H). The additional semiconductor channel portions 1C may electrically couple the semiconductor channel portions of the protrusions 1B to a conductive source line outside of the view of FIG. 3H. A first gate insulating layer 303 may extend generally parallel to the major surface of the substrate 100 and may be located between the select gate electrode 304 and the substrate 100. A second gate insulating layer 306 may extend generally perpendicular to the major surface of the substrate 100, and may be located between the select gate electrode 304 and first and second opposing side surfaces of each of the protrusions 1B. Discrete carbon etch stop layers 333 are located above each of the protrusions 1B and may function as a stopper to prevent punch through to the protrusions 1B during an etching process to form memory openings for NAND strings above the lower (e.g., source) select gate device level 50 as described further below.

A monolithic three-dimensional NAND string memory device may be fabricated by providing a stack 120 of alternating layers of a first material 19 and a second material 21 different from the first material 19 over the substrate 100, and forming one or more memory openings 81 in the stack 120 that extend through the layers in a direction that is substantially perpendicular to the major surface of the substrate 100. FIGS. 4A-4I illustrate one method of forming NAND strings 150 in a stack 120 over a substrate 100. In this embodiment, the stack 120 includes a lower (e.g., source) select gate device level 50 located below the future location of the memory device levels 70, as shown in FIG. 4A. The select gate device level 50 may be formed as described above and shown in FIGS. 3A-3H. Other fabrication methods and/or select gate device level 50 configurations may be used. For example, a lower select gate device level 50 may be fabricated as described in U.S. patent application Ser. No. 14/133,979, filed on Dec. 19, 2013, U.S. patent application Ser. No. 14/225,116, filed on Mar. 25, 2014, and/or U.S. patent application Ser. No. 14/225,176, filed on Mar. 25, 2014, all of which are incorporated by reference herein for all purposes.

In embodiments, discrete carbon etch stop layers 333 may be provided above the semiconductor protrusions 1B, and may be separated from one another by a dielectric material layer 337, as described above in connection with FIG. 3H. The carbon etch stop layers 333 may have a relatively low etch rate using a first etch process (e.g., a reactive ion etch process).

The three dimensional memory device levels 70 may be fabricated over the carbon etch stop layers 333 and the dielectric material layer 337 by depositing a plurality of alternating layers 19, 21 of a first material and a second material different than the first material as shown in FIG. 4A. Layers 19, 21 may be deposited by any suitable deposition method, such as sputtering, CVD, PECVD, MBE, ALD, etc. The layers 19, 21 may be 6 to 100 nm thick.

In this embodiment, the first layers 19 comprise an electrically insulating material. Any suitable insulating material may be used, such as silicon oxide, silicon nitride, silicon oxynitride, a high-k dielectric (e.g., aluminum oxide, hafnium oxide, etc. or an organic insulating material). The second layers 21 may comprise a semiconductor material (e.g., silicon, such as polysilicon). In one embodiment, layers 19 comprise silicon oxide and layers 21 comprise polysilicon.

The deposition of layers 19, 21 is followed by etching the stack 120 to the carbon etch stop layers 333 to form a plurality of front side openings 81 in the stack 120. An array of a front side openings 81 (e.g., cylindrical memory openings or holes) may be formed in locations where vertical channels of NAND strings 150 will be subsequently formed, as shown in FIGS. 4E-4G.

The openings 81 may be formed by photolithography and etching, as follows. First, a memory hole mask 130 is formed over the stack and patterned to form openings 131 exposing the stack 120, as shown in FIG. 4B. Mask 130 may comprise any suitable material, such as one or more layer of photoresist and/or hard mask material (e.g., photoresist over silicon nitride and amorphous carbon layers). Then, the stack 120 may be etched (e.g., using reactive ion etching (RIE)) to form the openings 81 in the stack through the openings 131 in mask 130, stopping the etch at the carbon etch stop layers 333, as shown in FIG. 4C. As discussed above, carbon etch stop layer 333 may have a lower RIE etch rate than the materials of the alternating layers 19, 21 of the stack 120. Thus, the layers 19, 21 may be more easily etched using RIE than the etch stop layer 333. The etching process used to form the front side memory openings 81 may be stopped at the carbon etch stop layer 333 without exposing the surface of the protrusions 1B in the openings 81, as shown in FIG. 4C.

Each of the front side openings 81 (e.g., cylindrical memory openings or holes) may include a sidewall 405 that extends substantially perpendicular to the major surface of the substrate 100 and is defined by the exposed surfaces of the alternating layers 19, 21 of the first insulating material and the second semiconductor material, and a bottom 407 defined by the carbon etch stop layer 333. The front side opening 81 may include a second width dimension (e.g., a diameter), $W_2$, at the bottom of the opening 81 proximate to the carbon etch stop layer 333, as shown in FIG. 4C. The second width dimension, $W_2$, at the bottom of the opening 81 may be smaller than the first width dimension, $W_1$, of the adjacent carbon etch stop layer 333 (see FIG. 3H).

In FIG. 4D, the carbon etch stop layers 333 may be removed to provide void areas 409 between the bottom of the memory openings 81 and the top surfaces of the protrusions 1B. The void areas 409 may have the same width dimensions, $W_1$, as the carbon etch stop layers 33 (see FIG. 3H), and may thus have larger width dimensions than the width dimensions $W_2$ at the bottoms of the memory openings 81. In other words, the void area 409 formed by the removal of the carbon etch stop layer 333 exposes a larger area of the top surface 325 of the protrusion 1B than would be exposed if the front side opening 81 were extended to the top surface 325 of the protrusion 1B (i.e., if the carbon etch stop layer 333 were not present, and the front side memory opening 81 was formed by etching the stack 120 until the top surface 325 of the protrusion 1B is reached at the bottom of the opening 81). By exposing a larger surface area at the top surface 325 of the protrusion 1B, a more effective electrical contact may be made with the future channel 1 of the NAND string 150 formed in the opening 81 while providing a high aspect ratio of the opening 81, as described in further detail below. In embodiments, the carbon etch stop layers 333 may be removed by ashing.

FIGS. 4E-H illustrate a method of forming the NAND memory strings 150 within the front side memory openings 81. As shown in FIG. 4E, at least one memory film 7, 9, 11 is formed in the memory openings 81, including over the sidewalls 405 of the memory openings 81, into the void areas 409 and over the exposed surfaces of the protrusions 1B at the bottoms of the memory openings 81. The at least one memory film 7, 9, 11 may also be formed over the top of the stack 120, as shown in FIG. 4E. The at least one memory film includes one or more functional layers such as a blocking dielectric layer 7, a charge storage layer 9, and/or a tunneling dielectric layer 11 as described above in connection with FIGS. 1A-2. The blocking dielectric layer 7 may be formed over the sidewall 405 and within the void area 409 of the memory opening 81 and over the exposed surface 325 of the protrusion 1B at the bottom of the memory opening 81. The charge storage layer 9 may be formed over the blocking dielectric layer 7, and the tunneling dielectric 11 may be formed over the charge storage layer 9 in the memory opening 81, as shown in FIG. 4E.

Then, a cover layer 410 may be formed over the at least one memory film 7, 9, 11 in the memory openings 81 and over the stack 120, as shown in FIG. 4E. A purpose of the cover layer 410 is to protect the memory film 7, 9, 11 over the sidewall 405 of the memory opening 81 from damage during a subsequent etching step. The cover layer 410 may be a semiconductor material, such as amorphous silicon or polysilicon that may form a portion of the future semiconductor channel 1 of the NAND string, as discussed below. Alternatively, the cover layer 410 may comprise a sacrificial material, such as amorphous silicon, polysilicon, silicon nitride or carbon, that protects the memory film 7, 9, 11 over the sidewall 405 during an etching step and is then removed from the memory opening 81 prior to formation of the semiconductor channel 1.

As shown in FIG. 4E, the at least one memory film 7, 9, 11 and the cover layer 410 may each comprise a first portion 411 that extends over the sidewall 405 of the memory opening 81 in a direction that is substantially perpendicular to the major surface of the substrate 100 and a second portion 413 that extends over the top surface 325 of the protrusion 1B in a direction that is substantially parallel to the major surface of the substrate 100.

As shown in FIG. 4F, portions of the at least one memory film 7, 9, 11 and the cover layer 410 may be removed in the horizontally-extending second portion 413 (see FIG. 4E) to define a generally cylindrically-shaped opening 417 through the second portion 413 of the at least one memory film 7, 9, 11 and the cover layer 410 that exposes the top surface of the protrusion 1B. The at least one memory film 7, 9, 11 and cover layer 410 may be etched using RIE or another suitable anisotropic wet or dry etching method to form the opening 417. The cover layer 410 protects the at least one memory film 7, 9, 11 along the sidewalls 405 of the memory openings 81 from etching damage. The etching may be performed through a patterned mask (not shown) that covers the top of the stack 120 to protect the rest of the stack form etching damage. Alternatively, the mask may be omitted and a sidewall spacer anisotropic etch may be used to remove the horizontal portions of layers 7, 9, 11 and 410 while leaving the vertical portions of these layers in place as sidewall spacers.

In some embodiments, after the openings 417 are formed to expose the surface of the protrusions 1B, at least a portion of the cover layer 410 may be removed from the openings 81, including from over the sidewalls 405 of the openings 81. For example, the cover layer 410 may be removed by a selective wet etch. Where the cover layer 410 comprises carbon, the cover layer 410 may be removed by ashing. In embodiments where the cover layer comprises a sacrificial material (e.g., amorphous silicon, silicon nitride, carbon, etc.), the cover layer 410 may be completely removed from the openings 81 prior to the formation of a channel 1 in the openings 81 (FIG. 4G). In embodiments where the cover layer 410 comprises a semiconductor material (e.g., amorphous silicon or polysilicon) all or a portion of the cover layer 410 may remain in the memory opening 81 and may form a portion of a semiconductor channel of a NAND string, as described below. In such cases, a separate cover layer 410 removal step may be omitted.

In FIG. 4G, a semiconductor channel material 419 is formed in the memory openings 81 and within the opening 417 such that the semiconductor channel material 419 makes contact with the top surface 325 of the semiconductor channel protrusions 1B. The semiconductor channel material 419 may comprise, for example, amorphous silicon or polysilicon. Where all or a portion of the cover layer 410 remains in the opening 81, the semiconductor channel material 419 may be formed over the cover layer 410, and the semiconductor channel material 419 and the cover layer 410 may together form the semiconductor channel 1 as illustrated in FIGS. 1A-2. Alternatively, where the cover layer 410 has been removed, the semiconductor channel material 419 may be formed directly over the at least one memory film (e.g., the tunnel oxide layer 11) along the sidewall 405 of the memory opening 81, and may form the vertically extending semiconductor channel 1 as illustrated in FIGS. 1A-2. In either case, the at least one memory film 7, 9, 11 may be located between the semiconductor channel 1 and the sidewall 405 of the memory opening 81.

In embodiments, the cover layer 410 and/or the semiconductor channel material 419 may be initially deposited as an amorphous semiconductor material, and may be converted to a polycrystalline semiconductor material (e.g., polysilicon) by a recrystallization process, such as by a thermal treatment or laser annealing, to provide a polycrystalline semiconductor material channel 1.

As shown in FIG. 4G, a first portion 441 of the semiconductor channel 1 extends in the substantially vertical direction substantially perpendicular to the major surface of the substrate 100 over the at least one memory film 7, 9, 11 along the sidewall 405 of the memory opening 81 and a bottom second portion 443 of the semiconductor channel 1 extends in the substantially horizontal direction substantially parallel to the major surface of the substrate 100 over the memory film 7, 9, 11 and into the opening (e.g., open region 417) at the bottom portion of the memory opening 81 to electrically contact the top surface of the protrusion 1B.

An optional core insulating layer 2, such as a silicon oxide layer may be deposited in the openings 81 and over the stack 120 as shown in FIG. 4H. Layer 2 is also shown in FIGS. 1A and 1B. The stack 120 may then be planarized (e.g., by CMP) as shown in FIG. 4I to remove the channel, core insulating layer and the at least one memory film (e.g., layers 2, 419, 410, 11, 9 and 7) from the top of the stack 120. Alternately, a dry etch process (e.g., RIE) may be used to remove layers 2, 419, 410, 11, 9 and 7 from the top of the stack 120. An optional cover layer 445, such as a silicon oxide layer deposited by CVD using a tetraethyl orthosilicate (TEOS) source, may be formed over the stack as shown in FIG. 4I. Doped semiconductor layers 21 function as control gate electrodes of the NAND strings.

FIGS. 5A-5F illustrate an alternative method of forming NAND strings 150 in a stack 120 over a substrate 100. FIG. 5A corresponds to FIG. 4D, and shows the stack 120 after formation of the memory openings 81 and removal of the carbon etch stop layers 333 to form void areas 409 that expose the surfaces of the protrusions 1B at the bottoms of the memory openings 81. FIG. 5B shows the at least one memory film 7, 9, 11 formed over the stack 120 and in the memory openings 81, including over the sidewalls 405, within the void areas 409 and over the exposed surfaces of the protrusions 1B at the bottoms of the memory openings 81. Then, a cover layer 510 may be formed over the at least one memory film 7, 9, 11 in the memory openings 81 and over the stack 120, as shown in FIG. 5C. The cover layer 510 of FIG. 5C differs from layer 410 of FIG. 4E in that cover layer 510 is formed such that the cover layer 510 preferentially forms over the sidewall 405 of the memory opening 81 but not over the surface of the protrusion 1B at the bottom of the memory opening 81, as shown in FIG. 5C (i.e., the cover layer 510 lacks the horizontally extending portion 413 of the cover layer 410 shown in FIG. 4E). In this embodiment, the cover layer 510 may comprise a carbon material that is deposited by any suitable process, such as CVD. The selective formation of the carbon cover layer 510 over the sidewalls 405 but not over the bottom surface of the memory opening 81 may be promoted by controlling the parameters of the carbon deposition, such as the carbon deposition temperature, the thickness of the carbon cover layer 510 and the aspect ratio of the memory openings 81. The deposition parameters may otherwise be similar to non-conformal deposition processes.

FIG. 5D corresponds to FIG. 4F, and shows portions of the at least one memory film 7, 9, 11 removed (e.g., etched, such as via RIE) to define a generally cylindrically-shaped opening 417 that exposes the top surface of the protrusion 1B. In this embodiment, the carbon cover layer 510 does not extend over the horizontally-extending portions of the memory film 7, 9, 11 at the bottom of the memory hole 81, and thus the carbon cover layer 510 does not need to be etched to expose the top surface of the protrusion 1B. The carbon cover layer 510 extends over the memory film 7, 9, 11 along the sidewall 405 of the memory opening 81, and may protect the memory film 7, 9, 11 over the sidewall 405 from etching damage while the portions of the memory film 7, 9, 11 at the bottom of the memory opening 81 are etched to expose the surface of the protrusion 1B. The carbon cover layer 510 may then be removed, such as by ashing, as shown in FIG. 5E.

FIG. 5F shows a semiconductor channel material 419 formed in the memory openings 81 and within the opening 417 such that the semiconductor channel material 419 makes contact with the top surface of the semiconductor channel protrusions 1B. The semiconductor channel material 419 in this embodiment is formed directly over the at least one memory film (e.g., the tunnel oxide layer 11) along the sidewall 405 of the memory opening 81, and may form the vertically extending semiconductor channel 1 as illustrated in FIGS. 1A-2. The at least one memory film 7, 9, 11 is located between the semiconductor channel 1 and the sidewall 405 of the memory opening 81.

An optional core insulating layer 2 may be formed as shown in FIG. 4H, and the stack may be planarized with an optional cover layer 445 formed over the stack as shown in FIG. 4I.

FIGS. 6A-6F illustrate an alternative method of forming NAND strings 150 in a stack 120 over a substrate 100. FIG. 6A corresponds to FIGS. 4D and 5A, and shows the stack 120 after formation of the memory openings 81 and removal of the carbon etch stop layers 333 to form void areas 409 that expose the surfaces of the protrusions 1B at the bottoms of the memory openings 81. The stack 120 in FIGS. 6A-6F differs from the stack 120 in FIGS. 4A-4I and 5A-5F in that instead of alternating layers of a first insulating (e.g., an oxide, such as silicon oxide) material and a second semiconductor (e.g., silicon, such as polysilicon) material 21 (e.g., an OPOP stack), the stack 120 of FIGS. 6A-6F includes alternating layers of a first insulating (e.g., an oxide, such as silicon oxide) material 19 and a second sacrificial (e.g., a nitride, such as silicon nitride) material 121 (e.g., an ONON stack). In addition, as shown in FIG. 6A, a layer of semiconductor material 637 (e.g., intrinsic polysilicon) rather than dielectric material 337 is formed planar with and is located between each of the carbon etch stop layers 333 at the bottom of the memory openings 81. FIG. 6A depicts the stack 120 following removal of the carbon etch stop layers 333 as described above, such that the void areas 409 are defined within the semiconductor material layer 637.

In an alternative embodiment, the layer of intrinsic polysilicon 637 may serve as an etch stop layer for high aspect ratio memory hole etching. The stack 120 may be etched to form the memory openings 81 as described above, stopping the etch at the intrinsic polysilicon layer 637. A selective wet etch (e.g., using tetramethyl ammonium hydroxide) may be used to preferentially etch the intrinsic polysilicon layer 637 to widen the bottom width of the memory openings 81 (e.g., to a larger width dimension $W_1$ as described above) but not the surface of the protrusion 1B. The bottom lateral width of the opening 409 may be controlled by wet etch time.

The NAND strings 150 may be formed as described above in FIGS. 4E-4I or 5B-5F. For example, similar to the method shown in FIGS. 5B-5F, at least one memory film 7, 9, 11 may be formed over the stack 120 and in the memory openings 81, including over the sidewalls 405, within the void areas 409 and over the exposed surfaces of the protrusions 1B at the bottoms of the memory openings 81, as shown in FIG. 6B. Then, a cover layer 510 is formed such that the cover layer 510 preferentially forms over the sidewall 405 of the memory opening 81 but not over the surface of the protrusion 1B at the bottom of the memory opening 81, as shown in FIG. 6C (i.e., the cover layer 510 lacks the horizontally extending portion 413 of the cover layer 410 shown in FIG. 4E). As described above, the cover layer 510 may comprise a carbon material that is deposited by any suitable process, such as CVD. The selective formation of the carbon cover layer 510 over the sidewalls 405 but not over the bottom surface of the memory opening 81 may be promoted by controlling the parameters of the carbon deposition, such as the carbon deposition temperature, the thickness of the carbon cover layer 510 and the aspect ratio of the memory openings 81. The deposition parameters may otherwise be similar to non-conformal deposition processes.

In FIG. 6D, portions of the at least one memory film 7, 9, 11 may be removed (e.g., etched, such as via RIE) to define a generally cylindrically-shaped opening 417 that exposes the top surface of the protrusion 1B, while the carbon cover layer 510 protects the at least one memory film 7, 9, 11 from etching damage. Then, the carbon cover layer 510 may be removed, such as by ashing, as shown in FIG. 6E.

FIG. 6F shows a semiconductor channel material 419 formed in the memory openings 81 and within the opening 417 such that the semiconductor channel material 419 makes contact with the top surface of the semiconductor channel protrusions 1B. The semiconductor channel material 419 in this embodiment is formed directly over the at least one memory film (e.g., the tunnel oxide layer 11) along the sidewall 405 of the memory opening 81, and may form the vertically extending semiconductor channel 1 as illustrated in FIGS. 1A-2. The at least one memory film 7, 9, 11 is located between the semiconductor channel 1 and the sidewall 405 of the memory opening 81.

An optional core insulating layer 2 may be formed as shown in FIG. 4H, and the stack may be planarized with an optional cover layer 445 formed over the stack as shown in FIGS. 4I and 7A.

Figure 7E:
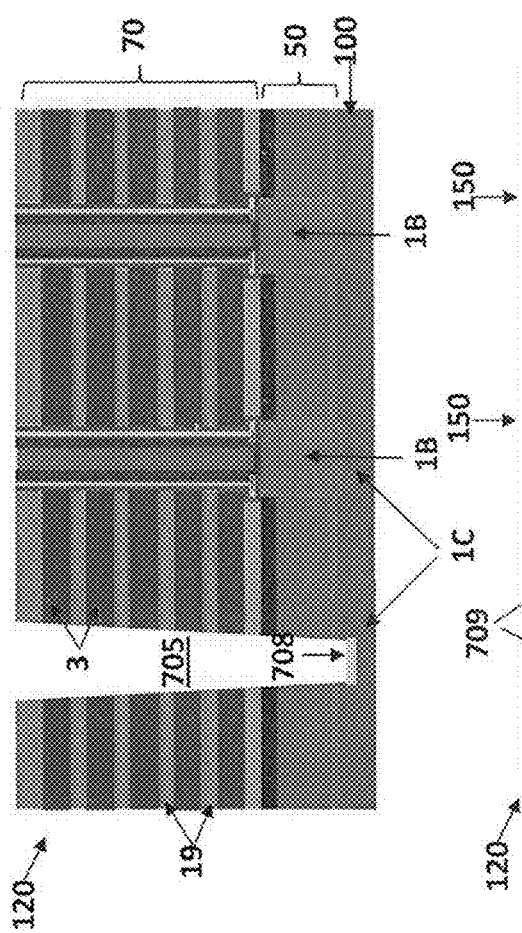

FIGS. 7A-7F illustrate additional processing steps that may be performed to remove the layers of sacrificial material 121 from the stack 120 and form control gate electrodes 3 for a vertical NAND memory string 150. The processing steps of FIGS. 7A-7F may be used to replace the alternating layers of sacrificial material 121 with a conductive gate electrode material in a stack 120 as shown in FIGS. 6A-6F (e.g., an ONON stack 120). In other embodiments, the processing steps of FIGS. 7A-7F may also be used to partially or completely replace the alternating layers of a semiconductor material 21 with a conductive gate electrode material in a stack 120 such as shown in FIGS. 4A-4I and 5A-5F (e.g., an OPOP stack 120). As shown in FIG. 7A, a mask 701 may be formed over the top of the stack 120. The mask 701 may be a photoresist and/or hard mask. At least one back side mask opening 703 is formed in the mask. Then, as shown in FIG. 7B, the stack 120 is etched through the opening(s) 703 in the mask to form one or more back side openings (e.g., trenches) 705a in the stack 120. In this embodiment, the back side opening (e.g., trench) 705a stops at the intrinsic polysilicon layer 637 which functions as an etch stop layer for a first trench etch.

Then, at least a portion of the sacrificial second material layers 121 may be removed through the back side openings 705a to form back side recesses 707 between the first material layers 19, as shown in FIG. 7B. Layers 121 may be removed by selective etching, such as a silicon nitride selective etching which removes silicon nitride layers 121 but does not remove the silicon oxide layers 19. The intrinsic polysilicon layer 637 may protect the upper layer of insulating material 311 (e.g., silicon nitride) in the lower select gate level 50 from being etched. The selective etch may stop on the oxide blocking dielectric 7, such as a silicon oxide blocking dielectric, that extends vertically in the memory openings 81.

If desired, back side opening 705a may be etched further at this time to extend the back side opening 705a through the intrinsic polysilicon layer 637 to the insulating layer 311. Alternatively, this step may be omitted at this time and combined with the etching step shown in FIG. 7D.

Electrically conductive control gate electrodes 3 may then be formed in the back side recesses 707 through the back side opening 705a, as shown in FIG. 7C. The control gate electrode 3 material may comprise any suitable material described above with respect to FIGS. 1A-2. For example, the material may comprise a TiN liner and tungsten gate material. The electrodes 3 may be formed by forming the electrically conductive control gate electrode material to partially or completely fill the back side opening 705a and to fill the back side recesses 707 such that the control gate electrode 3 material contacts the dielectric film 7 along the sidewalls of the memory openings 81. The electrode material may then be removed from the back side opening 705a (e.g., using anisotropic etching) without removing the material forming the electrodes 3.

In FIG. 7D, the stack 120 may be etched through a mask (not shown) or by using the top layer of the stack as a mask to form a second trench 705b that is continuous with the back side opening 705a. Together, the back side opening 705a and the second trench 705b may form a continuous trench 705 through the stack 120 to the substrate 100. The second trench 705b may be formed by etching through the intrinsic polysilicon layer 637 and the layers of the lower select gate level 50 (e.g., upper layer of insulating material 311, select gate electrode 304 and first gate insulating layer 303 as described above with respect to FIGS. 3A-3I) to the substrate 100. An optional doped source region 708 may be implanted into channel region 1C in the substrate 100 through the continuous trench 705, as shown in FIG. 7E. The source region 708 may be doped opposite conductivity type (e.g., n-type) from the conductivity type (e.g., p-type) of the channel region 1C.

Figure 7F:
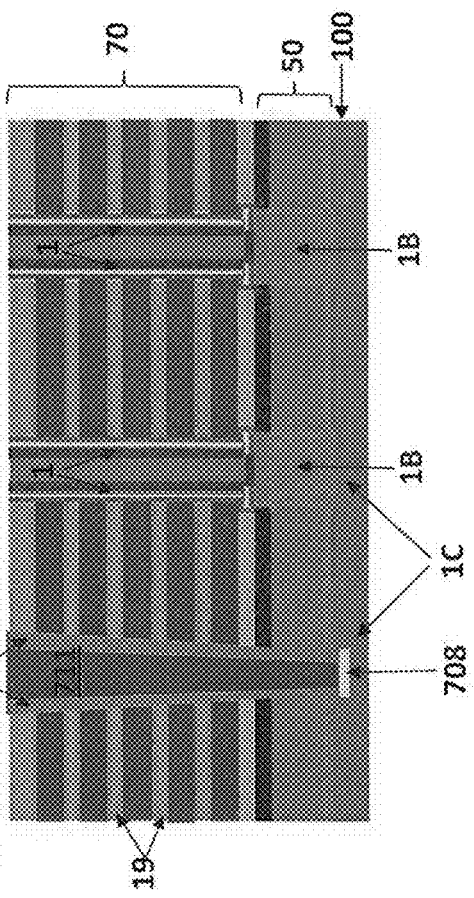

Then, as shown in FIG. 7F, an insulating layer 709, such as a silicon oxide or silicon nitride layer is formed on the sidewalls of the backside opening 705 such that the bottom surface of the backside opening 705 (e.g., the upper major surface of the semiconductor substrate 100) is exposed. A conductive source line 711 (e.g., a metal or metal nitride line, such as W, Ti, TiN, etc.) is then formed over the insulating layer 709 in the backside opening 705 such that the source line 711 contacts the source region 708 which in turn contacts the channel region 1C in the substrate 100. This forms an electrical connection between the source line and the channel portions 1, 1B and 1C. An upper (e.g., drain side) select gate electrode and transistor (not shown for clarity) may also be formed above the memory levels 70 of each NAND string 150.

Although the foregoing refers to particular preferred embodiments, it will be understood that the invention is not so limited. It will occur to those of ordinary skill in the art that various modifications may be made to the disclosed embodiments and that such modifications are intended to be within the scope of the invention. All of the publications, patent applications and patents cited herein are incorporated herein by reference in their entirety.

What is claimed is:

1. A method of fabricating a memory device, comprising:
    forming a carbon etch stop layer having a first width dimension over a major surface of a substrate;
    forming a stack of alternating layers of a first material and a second material different from the first material over the carbon etch stop layer;
    etching the stack through a mask to the carbon etch stop layer to form a memory opening having a second width dimension at a bottom of the memory opening proximate to the carbon etch stop layer that is smaller than the first width dimension of the carbon etch stop layer;
    removing the carbon etch stop layer while not removing the first material and the second material to provide a void area between the bottom of the memory opening and a top surface of a protrusion comprising a semiconductor material, the void area having a larger width dimension than the second width dimension of the memory opening;
    forming at least a portion of a memory film over a sidewall of the memory opening and in the void area while each layer of the first material and each layer of the second material are present within the stack of alternating layers; and
    forming a semiconductor channel in the memory opening such that the memory film is located between the semiconductor channel and the sidewall of the memory opening
    wherein forming the carbon etch stop layer comprises:
        forming a carbon layer over the top surface of the protrusion;
        removing portions of the carbon layer to provide the carbon etch stop layer having the first width dimension;
        forming a dielectric material layer adjacent to the carbon etch stop layer; and
        planarizing the dielectric material layer with a top surface of the carbon etch stop layer, wherein the stack of alternating layers of the first material and the second material is formed over the planarized surface of the carbon etch stop layer and the dielectric material layer.

2. The method of claim 1, further comprising:
    forming a first gate insulating layer over the major surface of the substrate;

forming a conductive select gate electrode over the first gate insulating layer;

etching the conductive select gate electrode layer and the first gate insulating layer through a mask to form an opening having sidewalls and a bottom surface, wherein the sidewalls are at least partially defined by the select gate electrode layer and the first gate insulating layer and the substrate is exposed in the bottom surface of the opening;

forming a second gate insulating layer on the sidewalls and the bottom surface of the opening;

forming a sacrificial carbon spacer layer over the gate insulating layer on the sidewalls of the opening and not over the bottom surface of the opening;

etching the gate insulating layer over the bottom surface of the opening to expose the substrate; and removing the sacrificial carbon spacer layer to expose the gate insulating layer over the sidewalls of the opening.

3. The method of claim 2, further comprising:

forming a protrusion comprising a semiconductor material in or over the major surface of a semiconductor substrate, wherein a top surface of the protrusion is substantially parallel to the major surface of the substrate and the carbon etch stop layer is formed over the top surface of the protrusion; and etching the memory film to expose the top surface of the protrusion;

wherein the semiconductor channel is formed in the memory opening such that the semiconductor channel contacts the top surface of the protrusion.

4. The method of claim 3, wherein forming the protrusion comprises epitaxially growing a semiconductor material within the opening between the two select gate electrodes.

5. The method of claim 4, further comprising:

planarizing the epitaxially grown semiconductor material to form the top surface of the protrusion.

6. The method of claim 5, wherein the semiconductor material is planarized by at least one of chemical-mechanical polishing and an etch back process.

7. The method of claim 4, wherein the epitaxially grown semiconductor material comprises silicon.

8. The method of claim 4, further comprising:

forming a doped region in a top surface of the protrusion.

9. The method of claim 3, further comprising:

forming a sacrificial material layer over the memory film along at least the sidewall of the memory opening; and etching the memory film at the bottom of the memory hole to expose the top surface of the protrusion while the sacrificial material layer protects the memory film along the sidewall of the memory opening.

10. The method of claim 9, wherein the sacrificial material layer comprises a semiconductor material that is formed over the memory film along the sidewall and bottom of the memory opening, and a portion of the sacrificial semiconductor material layer is etched with the memory film to expose the top surface of the protrusion.

11. The method of claim 10, wherein the sacrificial material layer comprises polysilicon.

12. The method of claim 10, wherein at least a portion of the sacrificial semiconductor material layer remains in the memory opening when the semiconductor channel is formed in the memory opening.

13. The method of claim 9, wherein the sacrificial material layer comprises at least one of silicon nitride and carbon.

14. The method of claim 13, further comprising removing substantially all of the sacrificial material layer from the memory opening before forming the semiconductor channel in the memory opening.

15. The method of claim 13, wherein the sacrificial material layer comprises carbon.

16. The method of claim 15, wherein the carbon is deposited so that it preferentially forms on the sidewall of the memory opening and not on the bottom surface of the memory opening.

17. The method of claim 15, wherein the carbon sacrificial layer protects the at least a portion of the memory film along the sidewall of the memory opening while the memory film is etched in the bottom of the memory opening to expose the top surface of the protrusion.

18. The method of claim 15, wherein the carbon sacrificial layer is removed from the memory opening by ashing.

19. The method of claim 1, wherein removing the carbon etch stop layer comprises ashing the carbon etch stop layer.

20. The method of claim 1, wherein forming the semiconductor channel in the memory opening comprises:

depositing amorphous silicon in the memory opening; and converting at least a portion of the amorphous silicon to single crystal silicon or polysilicon using a recrystallization process.

21. The method of claim 1, further comprising:

depositing a dielectric material in a core of the memory opening such that the semiconductor channel concentrically surrounds the dielectric material.

22. The method of claim 21, wherein the dielectric material comprises $SiO_2$.

23. The method of claim 1, wherein the protrusion contacts a second portion of the semiconductor channel in or above the substrate that extends substantially parallel to the major surface of the substrate.

24. The method of claim 1, wherein the least one memory film comprises a charge trapping layer or floating gate and a tunnel dielectric, and the tunnel dielectric is located between the charge trapping layer or floating gate and the semiconductor channel.

25. The method of claim 24, wherein the at least one memory film further comprises a blocking dielectric.

26. The method of claim 1, further comprising:

forming a plurality of protrusions comprising a semiconductor material in or over the major surface of the semiconductor substrate, each protrusion having a top surface substantially parallel to the major surface of the substrate;

forming a plurality of carbon etch stop layers having a first width dimension over the top surface of each protrusion, such that the stack of alternating layers of the first material and the second material is formed over the plurality of the carbon etch stop layers;

etching the stack through the mask to the plurality of the carbon etch stop layers to form a plurality of memory openings having the second width dimension proximate to the plurality of the carbon etch stop layers that is smaller than the first width dimension of each of the plurality of carbon etch stop layers;

removing the plurality of the carbon etch stop layers to provide a plurality of void areas between the top surfaces of the protrusions and the bottoms of the memory openings, each of the void areas having a larger width dimension than the second width dimension of the plurality of the memory openings;

forming at least a portion of the memory film over the sidewalls of the plurality of the memory openings and the top surfaces of the protrusions;

etching the memory film to expose the top surfaces of each protrusion; and forming semiconductor channels in the memory openings such that the semiconductor channels contact the top surfaces of the protrusions and the plurality of the memory films are located between the semiconductor channels and the sidewalls of the plurality of the memory openings.

27. The method of claim 1, wherein a select gate device level containing a source select gate transistor including a select gate electrode is located below memory device levels containing control gate electrodes.

28. The method of claim 27, wherein the semiconductor channel extending in the memory opening through the memory device levels has a pillar shape, and the entire pillar shaped semiconductor channel in the memory device levels extends substantially perpendicularly to the major surface of the substrate.

29. The method of claim 27, wherein the first material comprises an insulating material and the second material comprises a sacrificial material.

30. The method of claim 29, further comprising:

forming the select gate device level below the stack of alternating layers;

removing the sacrificial material layers from the stack of alternating layers to form recesses; and forming the control gate electrodes in the recesses to form the memory device levels.

31. The method of claim 1, wherein the sidewall of the memory opening extends substantially perpendicular to the major surface of the substrate from a bottommost layer in the stack of alternating layers and to a topmost layer of alternating layers during formation of the memory film.

32. The method of claim 1, further comprising replacing layers of the second material within the alternating stack with control gate electrodes after formation of the memory film.

* * * * *